United States Patent [19]

Cheng et al.

[11] Patent Number: 5,691,250

[45] Date of Patent: Nov. 25, 1997

[54] METHOD OF FORMING A METAL CONTACT TO A NOVEL POLYSILICON CONTACT EXTENSION

[75] Inventors: Bo-Jeih Cheng; Chang Fu, both of Hsin-Chu; Jen Song Liu, Taipei, all of Taiwan

[73] Assignee: Taiwan Semiconductor Manufacturing Company, Ltd, Hsin-Chu, Taiwan

[21] Appl. No.: 705,452

[22] Filed: Aug. 29, 1996

[51] Int. Cl.[6] .................................................. H01L 21/324
[52] U.S. Cl. .......................... 437/247; 437/194; 437/240; 437/982
[58] Field of Search ................................. 437/193, 194, 437/240, 247, 248, 982; 148/DIG. 133

[56] References Cited

U.S. PATENT DOCUMENTS 4,341,009  7/1982  Bartholomew et al. ............. 437/191
5,250,468 10/1993  Matsuura et al. .................... 437/240
5,578,523 11/1996  Fiordalice et al. ................... 437/194

*Primary Examiner*—Chandra Chaudhari
*Attorney, Agent, or Firm*—George O. Saile; Stephen B. Ackerman

[57] ABSTRACT

A method has been developed for forming a metal contact structure, to an underlying polysilicon contact extension structure, without degrading the polysilicon contact extension structure during the metal contact structure patterning procedure. The process features opening a hole in an insulator layer, to an underlying polysilicon extension structure. The overlying metal contact structure is then patterned to have a width larger then the width of the opened hole in the insulator. Therefore the underlying polysilicon contact extension structure is not exposed to the RIE procedures used to define the metal contact structure.

18 Claims, 5 Drawing Sheets

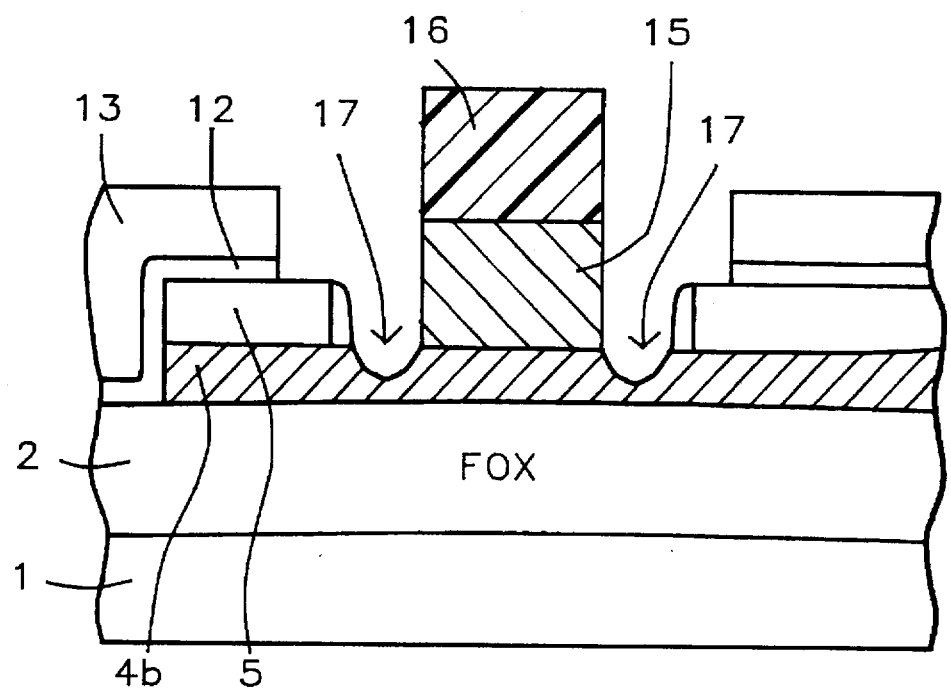
FIG. 6a – Prior Art
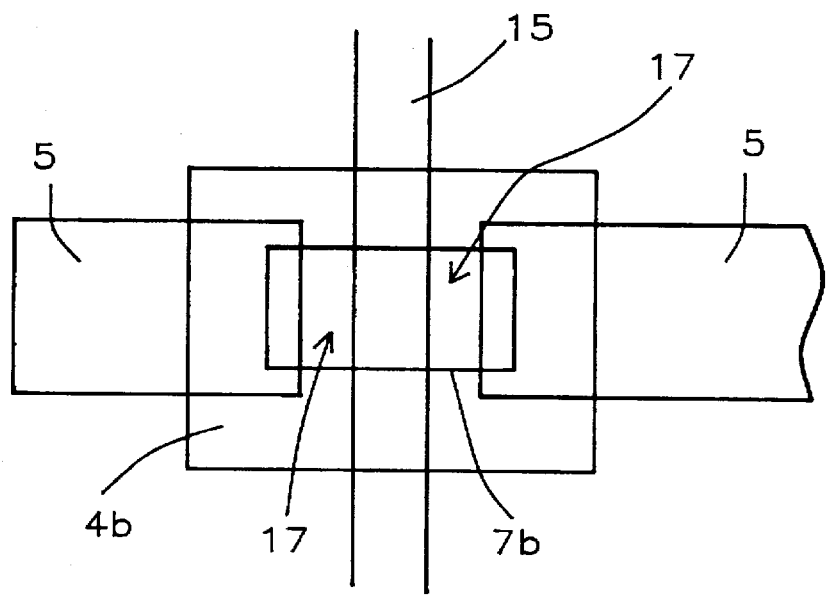
FIG. 6b – Prior Art

METHOD OF FORMING A METAL CONTACT TO A NOVEL POLYSILICON CONTACT EXTENSION

BACKGROUND OF THE INVENTION (1) Field of the Invention

The present invention relates to a method of fabricating a metal oxide semiconductor field effect transistor, (MOSFET), device, and more specifically methods used to improve the packing density of MOSFET devices by forming a metal contact to a polysilicon gate structure via the use of a contact extension.

(2) Description of Prior Art

The semiconductor industry is continually striving to increase the performance of semiconductor chips, while still maintaining, or even decreasing, the cost of the higher performing silicon chip. These objectives have been achieved via micro-miniaturazation, or the ability to create silicon chips with sub-micron features. The sub-micron features allow the performance objective to be realized by resulting in silicon devices exhibiting less parasitic capacitances and resistances, then counterparts fabricated with less aggressive groundrules. In addition the use of sub-micron features allow a greater number of smaller chips to be produced from a specific size starting wafer, thus reducing the cost of an individual chip. The attainment of micro-miniaturazation, or the use of sub-micron features, has occurred mainly as a result of advances in specific semiconductor fabrication disciplines, such as photolithograhy and reactive ion etching. For example the use of more sophisticated exposure cameras, as well as the development of more sensitive photoresist materials, have allowed sub-micron images to be routinely obtained in photoresist layers. In addition the use of more advanced dry etching equipment and processes, have resulted in the successful transfer of the sub-micron images in overlying photoresist layers, to underlying materials, used for the fabrication of advanced semiconductor chips.

The increased density of silicon devices, resulting from the use of sub-micron features, brings about specific silicon chip design changes, needed to achieve the objective of increased device packing density. For example contacts to a polysilicon gate electrode, of a MOSFET device, can no longer be made near the MOSFET channel region, due to a lack of available area. Therefore MOSFET designs are now being used in which the contact to a polysilicon gate structure, or word line, is made in a region of the chip, away from the MOSFET channel region. However the process of creating a polysilicon contact extension, has to be designed to still satisfy the performance criteria, as well as designed not to sacrifice yield and reliability objectives. Bartholomew, et al, in U.S. Pat. No. 4,341,009, describe a process of using a thin layer of polysilicon to contact a source and drain region of a MOSFET device, with the contact to the polysilicon being made over a thick field oxide region, away from the channel region. This invention will describe a process for using a polysilicon contact extension, for a polysilicon word line, in which the yield of the polysilicon contact extension, and the performance of the polysilicon contact extension, in terms of contact resistance, have been successfully addressed.

SUMMARY OF THE INVENTION

It is an object of this invention to create a polysilicon extension structure, to be used to connect an active device region in a MOSFET device, to an interconnect metallization structure.

It is another object of this invention to open a hole, in an insulator layer, overlying a polysilicon contact extension structure, on a thick field oxide region.

It is yet another object of this invention to form a metal contact structure, contacting the underlying polysilicon contact extension structure, via an opening in the insulator layer.

It is still yet another object of this invention to use a metal contact structure, larger then the opening in the insulator layer, so that the metal contact structure can be patterned using dry etching procedures, without attacking the underlying polysilicon contact extension, in the opened hole in the insulator layer, during an overetch cycle.

In accordance with the present invention a method is described for fabricating a MOSFET device, using a process to form a metal contact to a novel polysilicon contact extension structure. A polysilicon layer is deposited, subjected to an heavily doped N type process, followed by a deposition of a chemically vapor deposited silicon oxide layer. A small diameter, hole is opened in the silicon oxide layer, to expose an area of the underlying polysilicon layer, which overlies a thick field oxide region. Patterning of the overlying silicon oxide layer and the polysilicon layer is performed to create a polysilicon gate structure for a MOSFET device, in one region, while a polysilicon contact extension structure, connected to the polysilicon gate structure, is formed overlying the thick field oxide region, in another area of the MOSFET device. After source and drain processing is performed in the channel region of the MOSFET device, a layer of silicon nitride, followed by a layer of boro-phosphosilicate glass, (BPSG), is deposited. After patterning to form contact holes to the source and drain regions in one area of the MOSFET device, and to remove the overlying BPSG and silicon nitride layers, from the region surrounding the small diameter opening in silicon oxide, to the polysilicon contact extension structure, a sputtered metallization is performed. Patterning of the metallization layer is next accomplished via etching procedures, to create a metal contact structure to the underlying polysilicon extension structure, larger in diameter then the small opening, in the silicon oxide layer, used to expose the polysilicon extension structure.

BRIEF DESCRIPTION OF THE DRAWINGS

The object and other advantages of this invention are best explained in the preferred embodiment with reference to the attached drawings that include:

FIG. 6a, which schematically shows, in cross-sectional style, prior art of a metallized contact, to a polysilicon contact extension structure, in which the metal land is smaller in width than the contact hole opening in a silicon oxide layer, to the polysilicon contact extension structure.

FIG. 6b, which shows the top view of the prior art shown in FIG. 6a, of a metallized contact, to a polysilicon contact extension structure.

DESCRIPTION OF THE PREFERRED EMBODIMENTS

Figure 1:
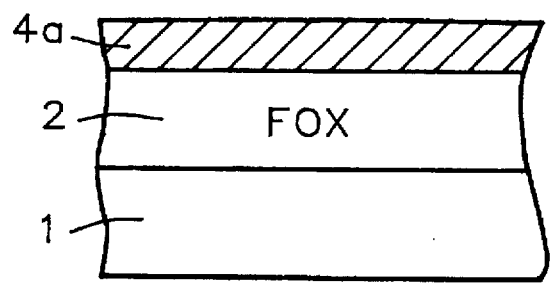
FIGS. 1–2, which schematically, in cross-sectional style, show the stages of fabrication used to create the narrow contact hole in a silicon oxide layer, overlying a polysilicon layer.

The method of forming a metal contact to a novel polysilicon contact extension structure, used for electrical connection to a gate structure of a MOSFET device, will now be covered in detail. The polysilicon contact extension structure can be used as part of MOSFET devices that are currently being manufactured in industry, therefore only the specific areas unique to understanding this invention, or specifically the polysilicon contact extension structure, will be described in detail. Fabrication of the polysilicon contact extension structure is performed simultaneously with the fabrication of the MOSFET devices, however the drawings in this invention will only describe the polysilicon contact extension procedure. The fabrication steps needed to create the MOSFET device will be described, however not shown in the drawings.

A P type, single crystalline silicon substrate, 1, having a <100> crystallographic orientation, is used. Thick field oxide regions, (FOX), 2, are formed in substrate, 1, for purposes of isolation. The FOX regions are produced by thermal oxidation of the silicon substrate, 1, in regions where the silicon is not masked by a composite oxidation mask, composed of an overlying layer of silicon nitride, and an underlying layer of silicon dioxide. The composite oxidation mask is patterned via conventional photolithographic and reactive ion etching, (RIE), procedures. After photoresist removal, via plasma oxygen ashing, followed by wet cleans, thermal oxidation is performed at a temperature between about 850° to 1050° C., in an oxygen—steam ambient, to grow between about 6000 to 8000 Angstroms of silicon dioxide. After removal of the composite oxidation mask, using hot phosphoric acid for the silicon nitride layer, and a buffered hydrofluoric acid solution for the underlying silicon dioxide layer, a thin, silicon dioxide, gate insulator is thermally grown for the MOSFET device, (not shown in the drawings), via thermal oxidation in an oxygen—steam ambient, at a temperature between about 800° to 1000° C., to a thickness between about 50 to 300 Angstroms. Next a polysilicon layer, 4a, is deposited using low pressure chemical vapor deposition, (LPCVD), processing, at a temperature between about 550° to 800° C., to a thickness between about 2500 to 3500 Angstroms. These process steps and layers are shown schematically in FIG. 1. The polysilicon layer, 4a, is doped via a POCl$_3$ process, at a temperature between about 925° to 975° C., to obtain a polysilicon surface concentration between about 5E19 to 5E20 atoms/cm$^3$. The polysilicon layer, 4a, can also be doped via arsenic or phosphorous, ion implantation, or grown by insitu doping techniques, via incorporation of either arsine or phosphine, into the silane ambient. However for all cases the desired polysilicon an N type, surface concentration of 5E19 to 5E20 atoms/cm$^3$ is obtained.

Figure 2:
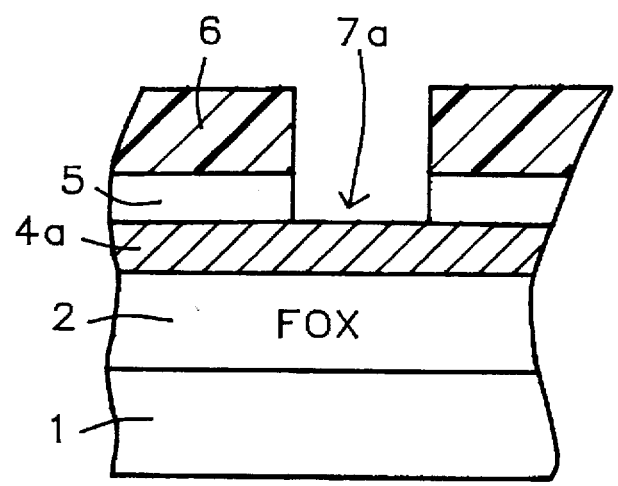

A layer of silicon oxide, 5, is next deposited using LPCVD or plasma enhanced chemical vapor deposition, (PECVD), processing, at a temperature between about 400° to 800° C., to a thickness between about 2500 to 3500 Angstroms, using tetraethylorthosilicate, (TEOS), as a source. Photoresist opening, 6, is formed and used as a mask to create opening, 7a, in the TEOS oxide layer, 5, via RIE procedures, using CHF$_3$ as an etchant. This is shown in FIG. 2. Opening, 7a, will be used to allow a subsequent metal structure to contact an underlying polysilicon contact extension structure. The dimensions of opening, 7a, between about 1.0 to 1.4 uM, in width, will be smaller then the width of a subsequent metal contact structure, and therefore are critical to this invention.

Figure 3A:
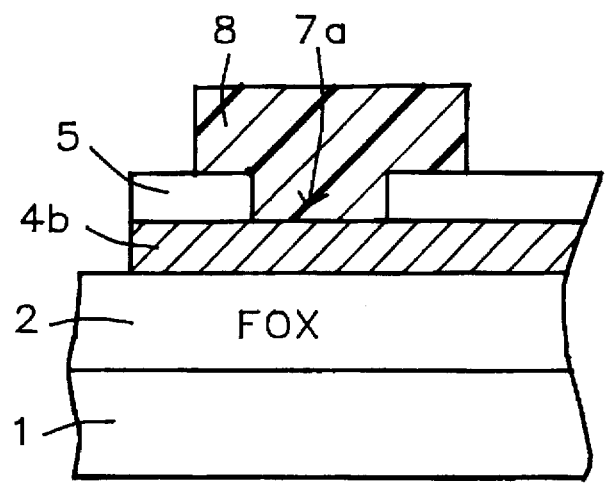
FIG. 3a, which schematically, in cross-sectional style, shows the patterning of a polysilicon layer that will be used for the polysilicon contact extension structure.
Figure 3B:
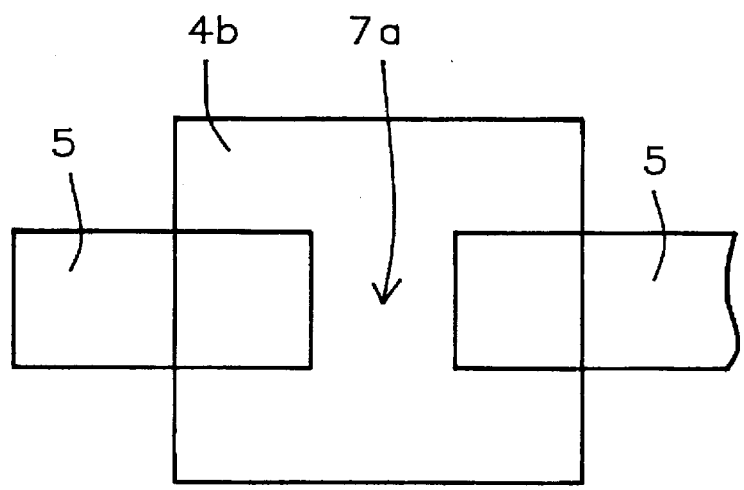
FIG. 3b, shows a top view of the polysilicon pattern that will be used for the polysilicon contact extension structure.

After removal of photoresist shape, 6, via plasma oxygen ashing, and wet cleans, another photoresist shape, 8, is formed to create a polysilicon gate structure in the MOSFET device region, (not shown in drawing). In addition, photoresist shape, 8, as well as a portion of silicon oxide layer, 5, are used as a mask to create the desired polysilicon shape, shown in FIG. 3a. The silicon oxide layer, 5, in areas in which it is not covered by photoresist shape, 8, is used as a hard mask during RIE procedures. The polysilicon contact extension structure, 4b, is obtained via RIE processing using Cl$_2$ as an etchant for polysilicon layer, 4a. This RIE procedure produces the polysilicon contact area, in opening, 7a, needed for subsequent metal contact, and also connects to the polysilicon gate structures, or word lines, of adjacent MOSFET structures. FIG. 3b, shows the top view of the polysilicon contact extension structure, at this stage of processing. Removal of photoresist shape, 8, is again accomplished via plasma oxygen ashing, followed by wet cleans.

The next process sequences are used to create the source and drain regions of the MOSFET device, are not critical to the invention of the polysilicon contact extension structure, but will be described, however not shown in the drawings. Briefly an N type, lightly doped, source and drain region is formed via ion implantation of phosphorous, at an energy between about 30 to 70 Kev., at a dose between about 1E12 to 5E13 atoms/cm$^2$. A layer of TEOS oxide is next deposited using LPCVD or PECVD processing, at a temperature between about 400° to 800° C., to a thickness between about 2500 to 3500 Angstroms. Anisotropic, RIE, processing, using CHF$_3$ as an etchant, is used to create a TEOS oxide spacer, followed by another ion implantation process, used to create N type, heavily doped, source and drain region. This implantation is performed using arsenic, at an energy between about 50 to 100 Kev., at a dose between about 1E14 to 5E15 atoms/cm$^2$.

Figure 4:
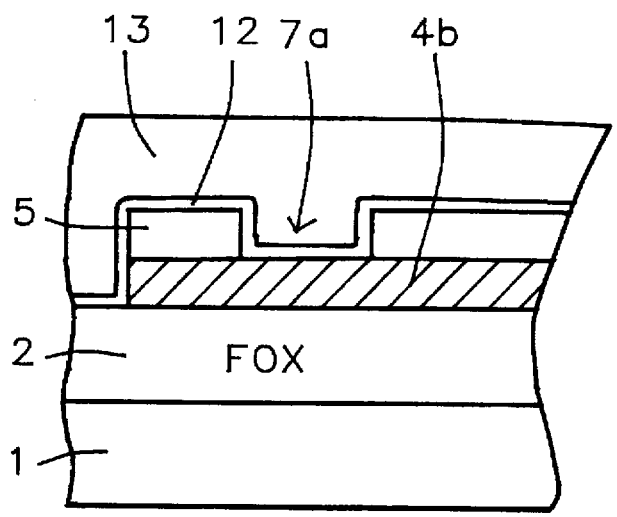
FIGS. 4–5, which schematically show the stages of fabrication used to create an opening in a dual insulator layer, larger in width than the narrow contact hole in a silicon oxide layer, overlying a polysilicon contact extension structure.
Figure 5:
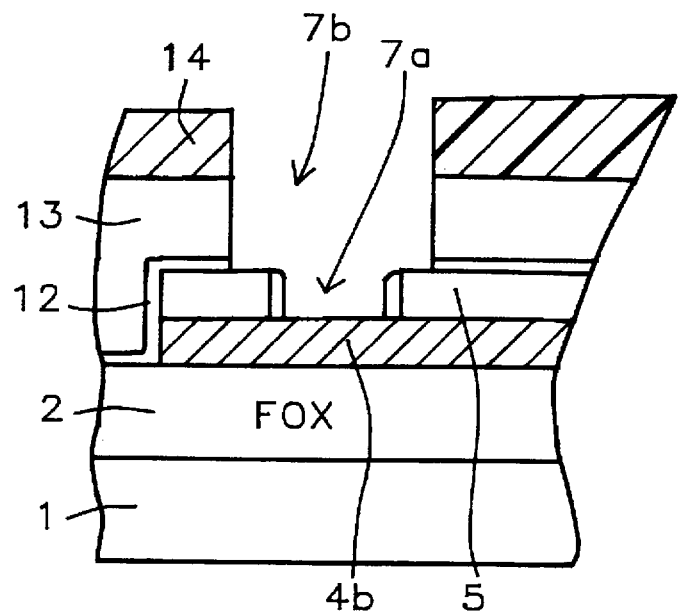

Continuing with the processing needed for the polysilicon contact extension structure, a deposition of a silicon nitride layer, 12, is performed using LPCVD or PECVD processing, at a temperature between about 400° to 800° C., to a thickness between about 200 to 400 Angstroms. This is followed by a deposition of a boro-phosphosilicate glass, (BPSG), layer, 13, using PECVD processing, at a temperature between about 490° to 510° C., to a thickness between about 2500 to 3500 Angstroms, containing between about 2.0 to 5.0% B$_2$O$_3$, and between about 3.0 to 6.0% P$_2$O$_5$. The BPSG layer is next subjected to a heat treatment at a temperature between about 900° to 940° C., for purposes of reflowing, to improve the surface planarity. These layers and sequences are schematically illustrated in FIG. 4. Another photolithographic procedure is employed, using photoresist shape, 14, to allow etching of BPSG layer, 13, and silicon nitride layer, 12, creating an opening to the source and drain region, 11, of the MOSFET device, (not shown in drawings), while exposing opening, 7a, in the polysilicon contact extension structure. The opening, 7b, in the BPSG layer, 13,—silicon nitride layer, 12, exposing opening, 7a, is between about 1.8 to 2.2 uM, in width. The removal of these layers is accomplished via RIE processing, again using $CHF_3$ as an etchant for both materials. This is schematically shown in FIG. 5. Photoresist shape, 14, is then removed using plasma oxygen ashing, followed by wet cleans, including a pre-metal exposure for between about 15 to 60 seconds, in a 50:1, buffered hydrofluoric solution.

A deposition of between 11000 to 13000 Angstroms of aluminum, containing between about 0.4 to 0.6% copper, and between about 0.9 to 1.1% silicon, is performed using r.f. sputtering. The critical patterning of a metal contact, 15, to the polysilicon contact extension structure, 4b, is next addressed. Prior art, shown schematically in FIG. 6a, shows a photoresist shape, 16, smaller in width than the width of opening, 7a, and used to create metal contact structure, 15. The metal contact structure is created via an anisotropic RIE procedure, using a $Cl_2$—$BCl_3$ etch chemistry, which is etches both metal and polysilicon at about the same rate. However to insure against poor uniformity in metal thickness, across the entire substrate, an overetch is performed. The non-selective RIE overetch in the $Cl_2$—$BCl_3$ ambient results in gouge, or crevice, 17, in the polysilicon contact extension structure, 4b, in the exposed areas of opening, 7b. A top view of this prior art is shown in FIG. 6b. The extent of crevice, 17, will result in a polysilicon contact extension structure exhibiting either resistance increases, or discontinuities. One solution to the gouging or crevicing phenomena, when using a metal shape, smaller then the opening to the polysilicon contact extension structure, and occurring during the over etch cycle, is the use of a selective, isotropic wet etch. The wet etch, selectively removing only residual metal, and not attacking underlying polysilicon, now has to be used in place of a non-selective RIE overetch procedure. However this additional procedure adds cost to the process, and the isotropic wet etch procedure can result in a severe undercut of the metal contact structure, thus increasing the resistance of the metal contact structure.

Figure 7A:
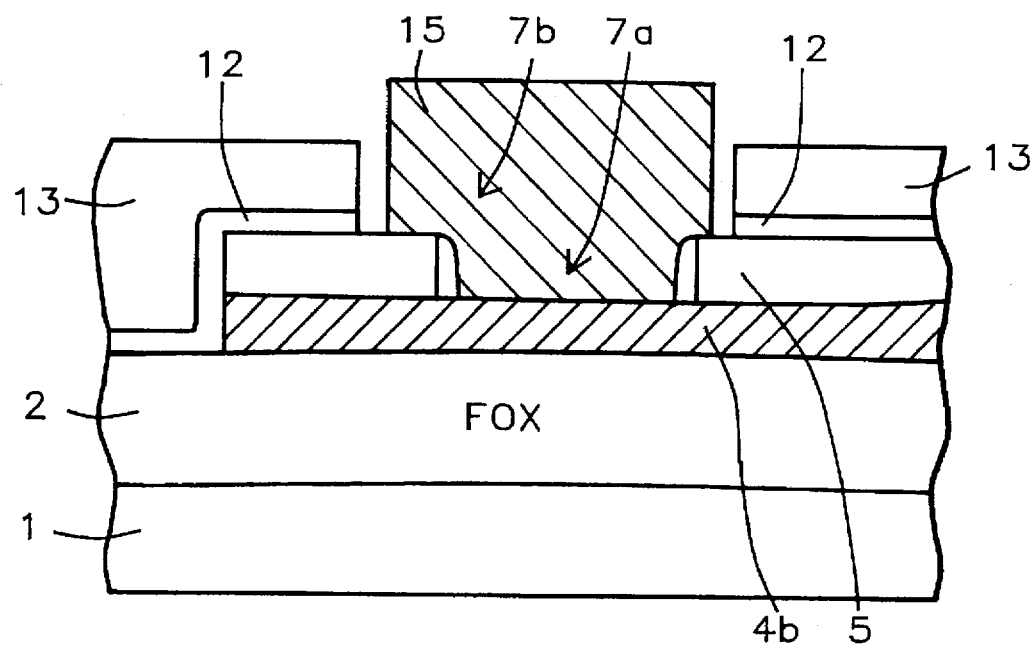
FIG. 7a, which schematically shows, in cross-sectional style, the metal contact to the polysilicon contact extension structure, described in this invention.
Figure 7B:
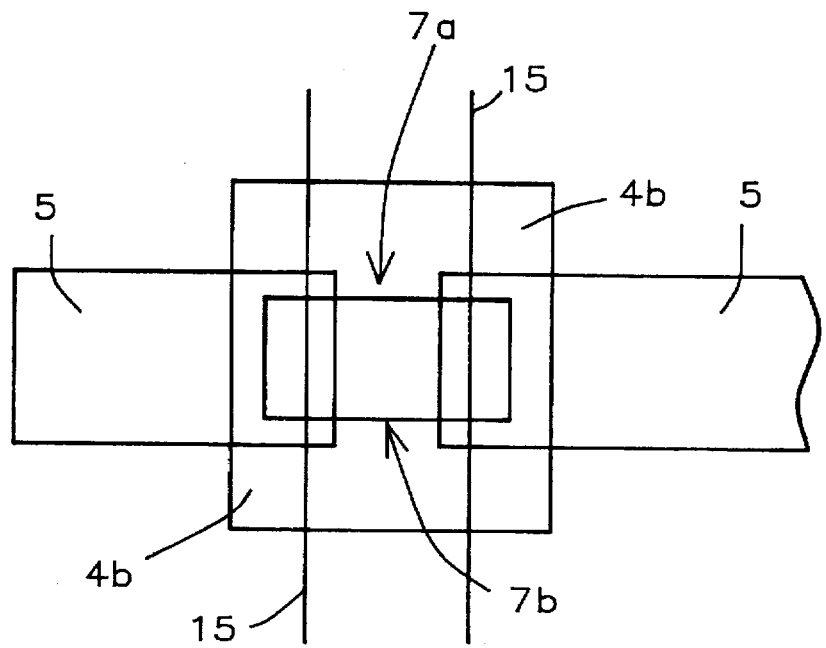
FIG. 7b, which shows the top view of a metallized contact, to a polysilicon contact extension structure, described in this invention.

A more practical solution to the crevice phenomena is described in FIGS. 7a–7b. Photoresist shape, 16, between about 1.4 to 1.8 uM, is again used, to define the metal contact structure, 15. However in this case photoresist shape, 16, and therefore metal contact structure, 15, are larger in width then opening, 7a, but smaller in width then opening, 7b. Therefore at the conclusion of the RIE procedure, a RIE overetch cycle can be safely employed to insure complete patterning of the metal contact structure, since the etchant, $Cl_2$—$BCl_3$ in this example, can not attack the polysilicon contact extension structure, protected by silicon oxide layer, 5. The use of a RIE overetch procedure removes the costly and metal profile degrading, wet overetch process, previously offered as a solution.

The area of polysilicon contact extension structure, 4b, has been enlarged in the area of metal contact, shown in FIG. 7b, when compared to the area of the polysilicon in the prior art, shown in FIG. 6b. This is to allow larger openings in insulator, 5, to the polysilicon contact extension structure, to be created if desired. This in turn would demand a larger metal shape, larger in width then the opening in insulator, 5. This procedure of increasing the contact area, would be used to optimize the contact resistance of metal to polysilicon, for specific designs. However the basic concept is to use a metal contact shape, larger in width, then a hole opening, used to contact an underlying polysilicon structure.

This process, used to create polysilicon contact extension structures for MOSFET devices, although described as part of an N channel, (NFET) device, can be applied to P channel, (PFET), devices, to complimentary, (CMOS) devices, as well as to BiCMOS devices.

While this invention has been particularly shown and described with reference to the preferred embodiments thereof, it will be understood by those skilled in the art that various changes in form and details may be made without departing from the spirit and scope of this invention.

What is claimed is:

1. A method of forming a metal contact structure, to a polysilicon contact extension structure, for a MOSFET device, on a semiconductor substrate, comprising the steps of:

growing a thick insulator layer on said semiconductor substrate;

patterning said thick insulator layer, to form field oxide regions, on said semiconductor substrate;

depositing a polysilicon layer on said semiconductor substrate, including deposition on said field oxide regions;

doping of said polysilicon layer;

deposition of a first dielectric layer on said polysilicon layer;

patterning to form a first hole opening in said first dielectric layer, to underlying said polysilicon layer;

patterning of said polysilicon layer to form a polysilicon contact extension structure, on said field oxide region;

depositing a second dielectric layer on top surface of said first dielectric layer, on sides of said first hole opening, in said first dielectric layer, and on top surface of said polysilicon contact extension structure, in said first hole opening;

depositing a third dielectric layer on said second dielectric layer;

annealing to reflow said third dielectric layer;

forming a second hole opening, in said third dielectric layer, and in said second dielectric layer, larger in diameter then said first hole opening, exposing said first hole opening, and top surface of said polysilicon contact extension structure, in said first hole opening;

deposition of a metal layer; and patterning of said metal layer to form a metal contact structure, larger in diameter then said first hole opening, and completely covering top surface of underlying said polysilicon contact extension structure, exposed in said first hole opening.

2. The method of claim 1, wherein said polysilicon layer is deposited intrinsically, using LPCVD processing, at a temperature between about 550° to 800° C., to a thickness between about 2500 to 3500 Angstroms, in a silane ambient.

3. The method of claim 1, wherein said polysilicon layer is doped using a $POCl_3$ procedure, at a temperature between about 925° to 975° C., to result in an N type surface concentration between about 5E19 to 5E20 atoms/$cm^3$.

4. The method of claim 1, wherein said first dielectric layer is silicon oxide, deposited using LPCVD or PECVD processing, at a temperature between about 400° to 800° C., to a thickness between about 2500 to 3500 Angstroms, using tetraethylorthosilicate as a source.

5. The method of claim 1, wherein said first hole opening, in said first dielectric layer, is accomplished via RIE processing, using $CHF_3$ as an etchant, with said first hole opening, exposing top surface of said polysilicon contact extension structure, having a width between about 1.0 to 1.4 uM.

6. The method of claim 1, wherein said second dielectric layer is silicon nitride, deposited using LPCVD or PECVD processing, at a temperature between about 400° to 800° C., to a thickness between about 200 to 400 Angstroms.

7. The method of claim 1, wherein said third dielectric layer is a boro-phosphosilicate glass layer, deposited using PECVD processing, at a temperature between about 490° to 510° C., to a thickness between about 2500 to 3500 Angstroms, and containing between about 2.0 to 5.0% $B_2O_3$, and between about 3.0 to 6.0% $P_2O_5$.

8. The method of claim 1, wherein said metal layer is aluminum, containing between about 0.4 to 0.6% copper, and between about 0.9 to 1.0% silicon, deposited using r.f. sputtering, to a thickness between about 11000 to 13000 Angstroms.

9. The method of claim 1, wherein said metal layer is patterned to create said metal contact structure via anisotropic, RIE processing, using $Cl_2$—$BCl_3$ as an etchant, with said metal contact structure having a width between about 1.4 to 1.8 uM.

10. A method of forming a metal contact structure, to a polysilicon contact extension structure, for a MOSFET device, on a semiconductor substrate, in which the width of said metal contact structure is larger then the width of the hole opening in an insulator, which is used to expose the underlying said polysilicon contact extension structure, comprising the steps of:

growing a thick insulator layer on said semiconductor substrate;

patterning of said thick insulator layer, to form field oxide regions, on said semiconductor substrate;

depositing a polysilicon layer on said semiconductor substrate, including deposition on said field oxide regions;

doping of said polysilicon layer;

deposition of a silicon oxide layer on said polysilicon layer;

patterning to form a first hole opening in said silicon oxide layer, to underlying said polysilicon layer;

patterning of said polysilicon layer, to form a polysilicon contact extension structure, on said field oxide region;

depositing a silicon nitride layer on top surface of said silicon oxide layer, on the sides of said first hole opening, in said silicon oxide layer, and on top surface of said polysilicon contact extension structure, in said first hole opening;

depositing a boro-phosphosilicate glass layer on said silicon nitride layer;

annealing to reflow said boro-phosphosilicate glass layer;

patterning to form a second hole opening in said boro-phosphosilicate glass layer, and in said silicon nitride layer, larger in width then said first hole opening in said silicon oxide layer, exposing said first hole opening, and top surface of said polysilicon contact extension structure, in said first hole opening;

deposition of a metal layer; and patterning of said metal layer to form a metal contact structure, larger in width then first hole opening in said silicon oxide layer, and completely covering top surface of underlying said polysilicon contact extension structure, exposed in said first contact hole.

11. The method of claim 10, wherein said polysilicon layer is deposited intrinsically, using LPCVD processing, at a temperature between about 550° to 800° C., to a thickness between about 2500 to 3500 Angstroms, in a silane ambient.

12. The method of claim 10, wherein said polysilicon layer is doped using a $POCl_3$ process, at a temperature between about 925° to 975° C., to result in an N type surface concentration between about 5E19 to 5E20 atoms/cm$^3$.

13. The method of claim 10, wherein said silicon oxide layer is deposited using LPCVD or PECVD processing, at a temperature between about 400° to 800° C., to a thickness between about 2500 to 3500 Angstroms, using tetraethylorthosilicate as a source.

14. The method of claim 10, wherein said first hole opening, in said silicon oxide layer, is formed using RIE procedures, using $CHF_3$ as an etchant, with said first hole opening having a width between about 1.0 to 1.4 uM.

15. The method of claim 10, wherein said silicon nitride layer is deposited using LPCVD or PECVD processing, at a temperature between about 400° to 800° C., to a thickness between about 200 to 400 Angstroms.

16. The method of claim 10, wherein said boro-phosphosilicate glass layer is deposited using PECVD processing, at a temperature between about 490° to 510° C., to a thickness between about 2500 to 3500 Angstroms, and containing between about 2.0 to 5.0% $B_2O_3$, and between about 3.0 to 6.0% $P_2O_5$.

17. The method of claim 10, wherein said metal layer is aluminum, containing between about 0.4 to 0.6% copper, and between about 0.9 to 1.1% silicon, deposited using r.f. sputtering, to a thickness between about 11000 to 13000 Angstroms.

18. The method of claim 10, wherein said metal layer is patterned to create said metal contact structure, via anisotropic, RIE processing, using $Cl_2$—$BCl_3$ as an etchant, with said metal contact structure having a width between about 1.4 to 1.8 uM.

* * * * *